US009985369B1

(12) United States Patent
Lu et al.

(10) Patent No.: US 9,985,369 B1
(45) Date of Patent: May 29, 2018

(54) METHOD AND APPARATUS TO MITIGATE ASSEMBLY TORSION

(71) Applicant: Arista Networks, Inc., Santa Clara, CA (US)

(72) Inventors: Duong Lu, Santa Clara, CA (US); Robert Wilcox, Santa Clara, CA (US); Richard Hibbs, Santa Clara, CA (US); Ian Fry, Santa Clara, CA (US); Arul Ramalingam, Santa Clara, CA (US); Jim Weaver, Santa Clara, CA (US); Tiffany Doria, Santa Clara, CA (US)

(73) Assignee: Arista Networks, Inc., Santa Clara, CA (US)

( * ) Notice: Subject to any disclaimer, the term of this patent is extended or adjusted under 35 U.S.C. 154(b) by 0 days. days.

(21) Appl. No.: 15/055,080

(22) Filed: Feb. 26, 2016

(51) Int. Cl.
*H01R 12/00* (2006.01)
*H01R 12/71* (2011.01)
*H01R 13/631* (2006.01)
*H01R 12/91* (2011.01)

(52) U.S. Cl.
CPC ......... *H01R 12/716* (2013.01); *H01R 13/631* (2013.01); *H01R 12/91* (2013.01); *H01R 13/6315* (2013.01)

(58) Field of Classification Search
CPC ............................ H01R 12/91; H01R 13/6315
USPC ............................................. 439/65, 246–248
See application file for complete search history.

(56) References Cited

U.S. PATENT DOCUMENTS

| | | | | |
|---|---|---|---|---|
| 5,199,892 A * | 4/1993 | Campbell | ............ | H01R 13/631 361/787 |
| 5,324,206 A * | 6/1994 | Conroy-Wass | ........ | H01R 12/62 439/638 |
| 5,392,371 A * | 2/1995 | Morlion | ............... | G02B 6/3817 385/52 |
| 6,033,247 A * | 3/2000 | Gregory, II | ........ | H01R 13/6315 439/247 |
| 8,226,442 B2 * | 7/2012 | Uusimaki | ............ | H01R 13/635 439/131 |
| 8,342,866 B2 * | 1/2013 | Taylor | .................. | H01R 13/637 439/197 |
| 9,017,087 B1 * | 4/2015 | Rossman | ............... | H01R 13/73 439/248 |

* cited by examiner

*Primary Examiner* — Tho D Ta
(74) *Attorney, Agent, or Firm* — Womble Bond Dickinson (US) LLP

(57) ABSTRACT

A mechanism to mitigate assembly torsion on an electronics assembly is provided. The mechanism including an electronics assembly and a first connector, mounted to the electronics assembly with a lower portion of the first connector proximal to the electronics assembly and an upper portion of the first connector distal to the electronics assembly. The mechanism includes a spring, mounted so as to press the upper portion of the first connector and preload the first connector against assembly force imparted by assembly of the first connector to a second connector. A method to mitigate assembly torsion on an electronics assembly is also provided.

19 Claims, 6 Drawing Sheets

METHOD AND APPARATUS TO MITIGATE ASSEMBLY TORSION

BACKGROUND

Electronics assemblies and connectors for coupling one electronics assembly to another are many and varied. Alignment of connectors during the mating of one electronics assembly to another is critical for electrical and electronic connection and system reliability. Printed circuit boards, housings, support members and other mechanical and electrical components can flex as a result of forces applied during assembly operations. This, plus differences in component dimensions and placement from manufacturing tolerances can cause misalignment of electrical connectors, resulting in marginal connection at the connectors, degraded signal levels and system reliability, yield loss and field failures. High-speed signals and large numbers of connections, with attendant high pin count connectors and greater numbers of connectors tend to exacerbate these problems. Traditional solutions to mitigate assembly torsion include adding stiffeners to a printed circuit board, using thicker printed circuit boards, enclosing circuits in a rigid housing or frame, using clamps on connectors, mounting connectors at ends of cables, use of special tools for installation, etc. Some of the solutions may not be applicable for various reasons, such as cost, reliance on printed circuit board thickness for circuit trace impedance, or reduction or elimination of cabling for cost reduction and short signal paths for high-speed signals. Even with some of the above solutions, an electronics assembly may flex, and misalign connectors. It is within this context that the embodiments arise.

SUMMARY

In some embodiments, a mechanism to mitigate assembly torsion on an electronics assembly. The mechanism including an electronics assembly and a first connector, mounted to the electronics assembly with a lower portion of the first connector proximal to the electronics assembly and an upper portion of the first connector distal to the electronics assembly. The mechanism includes a spring, mounted so as to press the upper portion of the first connector and preload the first connector against assembly force imparted by assembly of the first connector to a second connector.

In some embodiments, an electronics assembly is provided. The electronics assembly includes a first connector, mounted to the electronics assembly and configured to couple to a second connector that is mounted to a further electronics assembly, wherein a lower portion of the first connector is closer to the electronics assembly than an upper portion of the first connector. The assembly includes a spring, mounted to the electronics assembly and pressing the upper portion of the first connector so as to bias the first connector in opposition to an assembly force resulting from pressing the electronics assembly to couple the first connector to the second connector and the further electronics assembly.

In some embodiments, a method to mitigate assembly torsion on an electronics assembly is provided. The method includes mounting a first connector to an electronics assembly, with a lower portion of the first connector closest to the electronics assembly and mounting a spring to the electronics assembly, with a portion of the spring pressing an upper portion of the first connector so as to preload the first connector to oppose assembly force from assembly of the electronics assembly and the first connector to a second connector.

In some embodiment, a spring is provided. The spring includes a base and a cantilever spring extending from the base. Two arms extend from the base and the cantilever spring is between the two arms. Each arm has a mounting point at an end of the arm, the end of the arm located between a mid portion of the arm and a mid portion of the cantilever spring. The base, the cantilever spring and the two arms forming a unitary body, wherein the cantilever spring and each of the two arms flexes to participate in spring action of the spring.

Other aspects and advantages of the embodiments will become apparent from the following detailed description taken in conjunction with the accompanying drawings which illustrate, by way of example, the principles of the described embodiments.

BRIEF DESCRIPTION OF THE DRAWINGS

The described embodiments and the advantages thereof may best be understood by reference to the following description taken in conjunction with the accompanying drawings. These drawings in no way limit any changes in form and detail that may be made to the described embodiments by one skilled in the art without departing from the spirit and scope of the described embodiments.

DETAILED DESCRIPTION

A mechanism to mitigate assembly torsion on an electronics assembly, and a related method, are provided. The electronics assembly, which could be or include a populated printed circuit board (PCB), a circuit card, a tray, a drawer, an electronics box, etc., flexes as connectors of the electronics assembly are mated to connectors of another assembly such as a mid-plane, back-plane, card cage, printed circuit board, etc. One or more springs are mounted so as to press an upper portion of each of one or more connectors on the electronics assembly, which preloads each connector against assembly force imparted by assembly of that connector to another connector on the other assembly. Advantages and disadvantages of several types of springs, for such application, are herein described, as is a specific spring embodiment. It should be appreciated that descriptions of direction and orientation are for convenience of interpretation, and the apparatus is not limited as to orientation with respect to gravity. In other words, the apparatus could be mounted upside down, right side up, diagonally, vertically, horizontally, etc., and the descriptions of direction and orientation are relative to portions of the apparatus itself, and not absolute.

Figure 1:
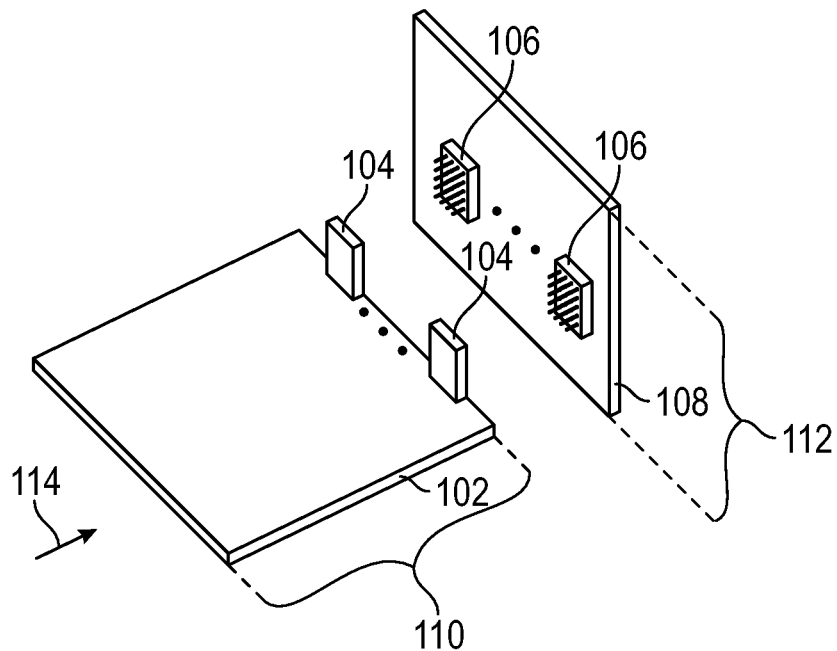
FIG. 1 is a perspective view of an electronics assembly that has one or more connectors, for connecting the electronics assembly to connectors of a mid-plane, back-plane, card cage or other assembly with connectors in accordance with some embodiments.

FIG. 1 is a perspective view of an electronics assembly 110 that has one or more connectors 104, for connecting the electronics assembly 110 to connectors 106 of a mid-plane, back-plane, card cage or other assembly 112 with connectors 106. Printed circuit boards 102, 108, or other substrates, members or supports for the connectors 104, 106 are depicted as bare, but should be understood as representative of fully populated electronics assemblies, with housings, rails, support members, integrated circuits, circuit traces, wires and/or other components omitted from the drawing, for clarity. In order to mate the connectors 104 of the electronics assembly 110 to the connectors 106 of the mid-plane or other assembly 112, the various connectors 104, 106 are brought into alignment, a forward force 114 is applied to the electronics assembly 110, for example along a back edge or the sides, and the electronics assembly 110 is pressed to the other assembly 108. A common example of this is seating an electronics card into a mid-plane, a backplane or a card cage. The forward force 114 is needed to overcome frictional forces produced by the mating of the connectors 104, 106, e.g., from pins and electrical contactors in pin sockets. Although the connectors 106 of the other assembly 112 are shown having pins extending, e.g., as male connectors, and the connectors 104 of the electronics assembly 110 have pin sockets, e.g., as female connectors, the use and arrangement of pins, pin sockets and/or other forms of connection, and selection of types and mixes of connectors, is specific to a given design and should not be seen as limiting the embodiments.

Figure 2:
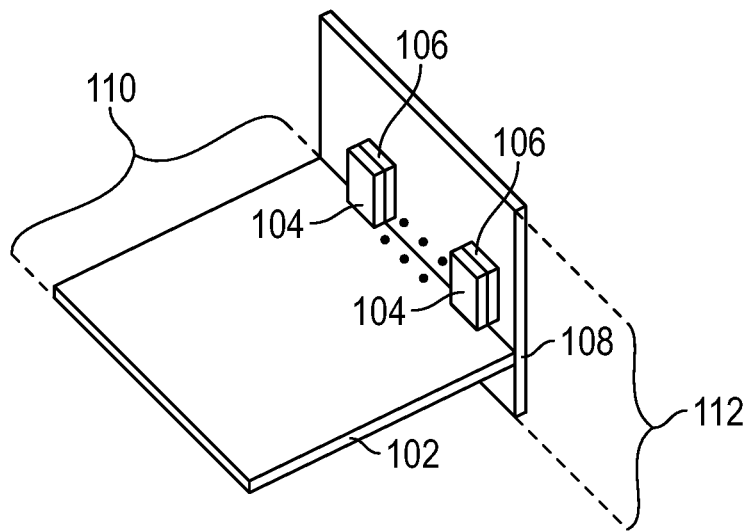
FIG. 2 is a side view of the electronics assembly fully mated to another assembly in accordance with some embodiments.

FIG. 2 is a side view of the electronics assembly 110 fully mated to the other assembly 112. Ideally, the connectors 104 of the electronics assembly 110 are aligned in parallel with the connectors 106 of the other assembly 112 and seated to uniform depth across the connectors 104, 106. Under such circumstances, signal transmission to and from the electronics assembly 110 is uniform and optimal through the connectors 104, 106. It should be appreciated that while a single assembly 110 is mated to assembly 112, a plurality of assemblies 110 may be integrated with assembly 112 on a single or multiple sides of assembly 112, as FIG. 2 is illustrative and not meant to be limiting.

Figure 3:
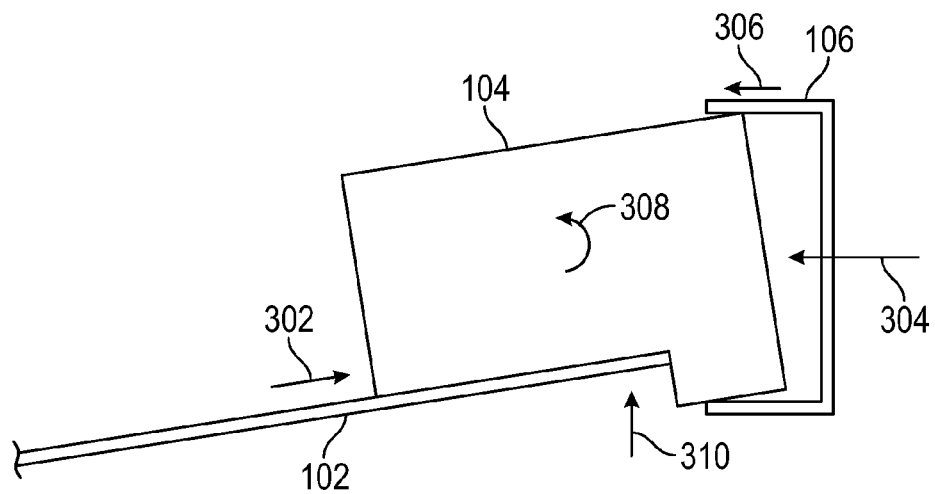
FIG. 3 is a stylized side view of the electronics assembly, depicting upwards flexure of the electronics assembly, and a connector of the electronics assembly tilting upwards or rearward due to assembly force in accordance with some embodiments.

FIG. 3 is a stylized side view of the electronics assembly 110, depicting upwards flexure of the electronics assembly 110, and a connector 104 of the electronics assembly 110 tilting upwards 310 or rearward 306 due to assembly force 304. The connector 104 is mounted to the electronics assembly 110, at an edge of the electronics assembly 110 (e.g., as an edge connector), with a lower portion of the connector 104 proximal to the electronics assembly, and an upper portion of the connector 104 distal to the electronics assembly. That is, the top of the connector 104 projects in an upwards direction from the main body of the electronics assembly 110, e.g., the printed circuit board 102 or other member of the electronics assembly 110 to which the connector 104 is mounted. Further examples, with connectors at other locations, orientations or mountings are readily devised. In this example, the printed circuit board 102 or other member experiences assembly torque due to various forces 302, 304 acting on the connector 104 during mating of the connectors 104, 106, and flexes, allowing the connector to move in an upward direction 310, and rotate 308 and tilt in a rearward direction 306. When there are multiple connectors 104 on the electronics assembly 110, each connector has a forward force 302 on the connector 104 that is equal to the forward force 114 applied to the electronics assembly 110 (see FIG. 1), minus frictional forces along sides or surfaces of the electronics assembly 110, divided by the number of connectors 104. Forward force 302 is experienced by the connector 104 as if applied to a lower portion of the connector 104, for purposes of analysis of flexure of the printed circuit board 102. Each connector 104 has expressed upon it an assembly force 304, from interaction of the two connectors 104, 106, and the stationary nature of the other assembly 112. Analysis of forces is similar if the electronics assembly 110 is held stationary and the other assembly 112 is pressed to the electronics assembly 110.

Calculations or simulations of the forward force 302 and assembly force 304 should be adjusted when differing types of connectors 104 or differing numbers of pins, etc., are used in differing connectors 104. For example, a connector 104 with a greater number of pins or pin sockets will likely experience a greater percentage or fraction of the forward force 114 as the forward force 302 applied to that connector 104, so as to seat the connector 104 against a larger assembly force 304 from interaction with the socket 106 of the mid-plane or other assembly 112. The assembly force 304 is expressed approximately at the middle of the front face of the connector 104, but could be above or below that depending upon layout of pins and pin sockets. Since the forward force 302 is acting on a lower portion of the socket 104, and this does not line up directly with the assembly for 304, there is a net rotational torque on the socket 104 and a related rotational torque on the printed circuit board 102. Because of such torsion, the printed circuit board 102 flexes with one portion moving in the upward direction 310 along with the socket 104. Rotation 308 and tilting in the rearward direction 306 of the socket 104 misaligns the sockets 104, 106, which degrades the physical and electrical connections and may even bend pins or lose pin connections. High-speed signals (e.g., in the gigahertz band) see impedance differences and distort, and system reliability suffers under the circumstances.

Figure 4:
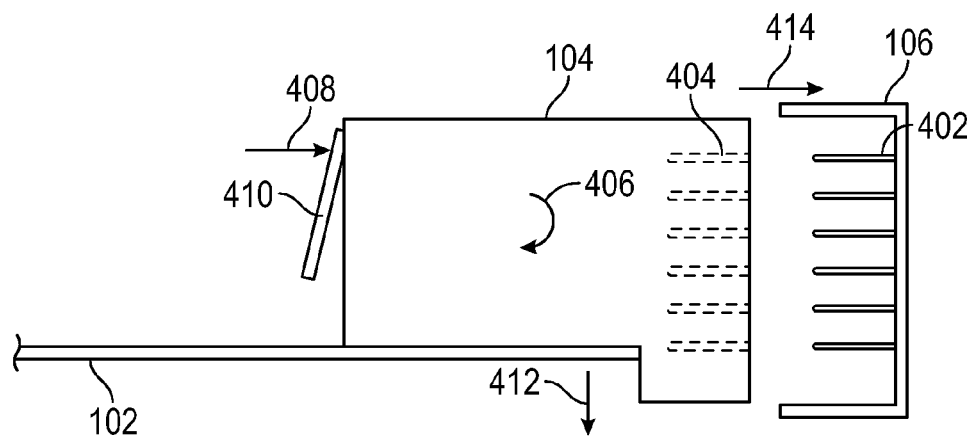
FIG. 4 is a stylized side view of the electronics assembly, showing a spring arranged to press on the connector, so as to apply a counteracting force that preloads the connector against the assembly force and produces downward flexure of the electronics assembly and forward or downward tilting of the connector of the electronics assembly, prior to assembly to the other connector in accordance with some embodiments.

FIG. 4 is a stylized side view of the electronics assembly 110, showing a spring 410 arranged to press on the connector 104, so as to apply a counteracting force 408 that preloads the connector 104 against the assembly force 304 and produces downward 412 flexure of the electronics assembly 110 and forward 414 or downward 412 tilting of the connector 104 of the electronics assembly 110, prior to assembly to the other connector 106. Thus, the spring 410 biases the connector 104 in opposition to the assembly force 304, and mitigates the torsion and flexing of the electronics assembly 110 produced by the assembly force 304. Example pins 402 and pin sockets 404, omitted in other drawings, are shown in the sockets 106, 104 for purposes of illustration, and should not be seen as limiting the embodiments. Springs, and advantages and disadvantages thereof, are further discussed with reference to FIGS. 6A-7C, and the specific spring 410 depicted in the drawing should not be seen as limiting the embodiments.

The spring 410 shown in FIG. 4, or another spring, could be attached directly to the printed circuit board 102, attached to the printed circuit board 102 via another member such as a support, or could be attached to the connector 104 or both the printed circuit board 102 and the connector 104. The spring 410 could approach and contact the connector 104 from below (as shown), above, to either side, or diagonally, etc. In further embodiments, the spring 410 could be pressed in place between a support member and the connector 104, or could have a lever, casing or pad, or other member attached to either end or some part of the spring 410. Force analysis in any of these cases shows the spring 410 or variation thereof is pressing on the connector 104 to apply the counteracting force 408.

Figure 5:
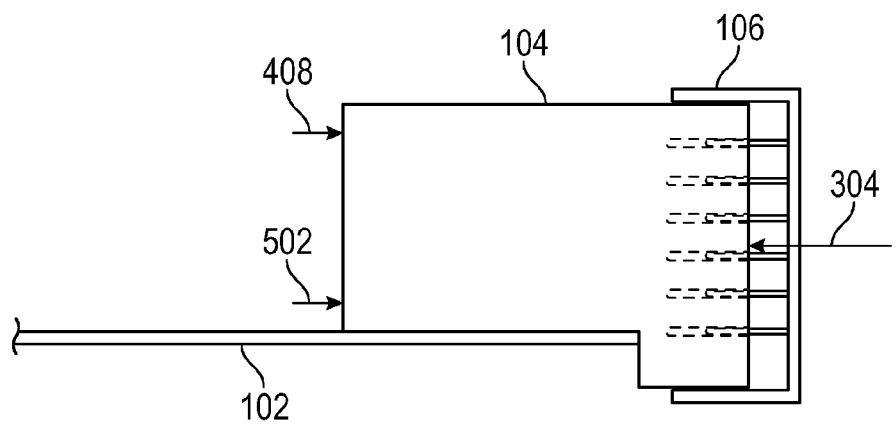
FIG. 5 is a stylized side view showing forces acting on the connector of the electronics assembly, which is parallel-aligned with the other connector as a result of the spring offsetting the assembly force in accordance with some embodiments.

FIG. 5 is a stylized side view showing forces 304, 408, 502 acting on the connector 104 of the electronics assembly 110, which is parallel aligned with the other connector 106 as a result of the spring 410 (not shown here, but see FIG. 4) offsetting the assembly force 304. With the forces 304, 408, 502 balanced, there is no rotation 308, 406 (See FIGS. 3 and 4) of the connector 104, and a front face of the connector 104 is parallel to a front face of the other connector 106. As shown in FIG. 5, the front face of the connector 104 mates to the front face of the other connector 106 evenly, and the printed circuit board 102 no longer flexes upwards or downwards. Seating depth of all of the pins 402 is even across the connectors 104, 106. This improves signal integrity, system reliability, yield loss and failure rates. In one embodiment, a spring constant of the spring 410 is tuned so that, for a worst-case assembly force 304, the parallel alignment depicted in FIG. 5 is achieved. This can be accomplished by analyzing tolerances, friction variations and other factors, and selecting a worst-case assembly force 304, then simulating or prototyping a spring with a shape and spring constant that achieves the desired alignment of connectors 104, 106. An assembly force 304 that is less than the worst-case value may see some rotation 406 or tilting in the forward direction 414 (see FIG. 4), but should not see rotation 308 or tilting in the rearward direction 306 (see FIG. 3) during assembly of the two connectors 104, 106.

FIGS. 6A-6F are perspective views of various types of springs. Choice of which type of spring to use is not merely an arbitrary design choice, but should be made with awareness of advantages and disadvantages of each type. The flat spring 602 in FIG. 6A, which has variations as a curved flat spring 604 in FIG. 6B, a cantilever spring 606 in FIG. 6C, and a leaf spring 612 composed of multiple leaves 614, 616, 618 in FIG. 6D, can fit in narrow spaces, but has a long extent. Flat springs 602, 604, 606, 612 are thus suitable for pressing against a tall connector 104 that is closely spaced to other components and thus has a narrow space for a spring 410. A curved flat spring 604 has a greater force when flattened or nearly so, as compared to a flat (i.e., non-curved) flat spring 602, and is thus suitable for producing a large amount of force in a narrow space for a given spring modulus of material. A leaf spring 612, built up of compound members (i.e., two or more leaves 614, 616, 618) produces a larger amount of force than a single flat spring 602 or curved, flat spring 604, but is thicker and experiences stiction. It is thus suitable for larger forces in less narrow spaces. The cantilever spring 606 is attached to a support member 608 at a fixed end of the cantilever spring 606, e.g., by a fastener 610. An opposed, free end of the cantilever spring 606 can apply a force to another object. The cantilever spring 606 is thus suitable for applying a force at a lateral distance from a mounting point.

Figure 6A:
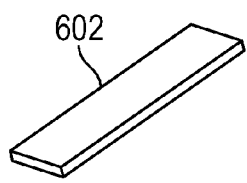
FIGS. 6A-6F are perspective views of various types of springs in accordance with some embodiments.
Figure 6B:
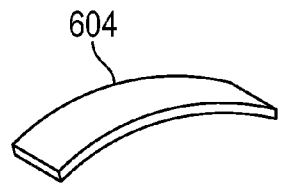
Figure 6C:
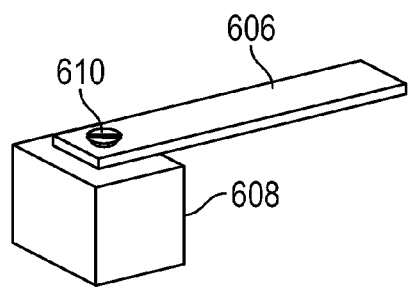
Figure 6D:
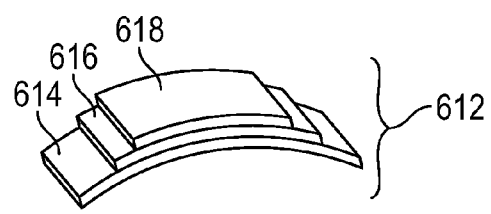
Figure 6E:
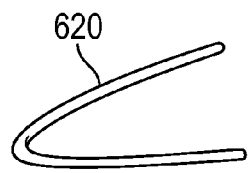
Figure 6F:
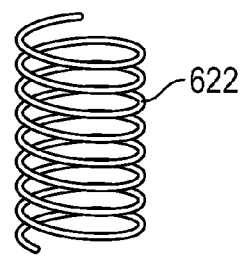

A V spring 620 is shown in FIG. 6E. This behaves rather like two flat springs 602 joined by a much smaller curved flat spring 604 that acts like a springy hinge. One advantage of the V spring 620 is that the forces at the free ends of the spring can be aligned, or if one of the ends is anchored similarly to a cantilever spring 606, the force expressed at the free end of the spring is aligned with the anchor point of the spring. Or, the V spring 620 can be anchored at the V point, and have two free ends moving in opposition. A coil spring 622 is shown in FIG. 6F. These have many variations, such as conical springs, spiral wound springs, flat spirals, dual windings, triple windings, with or without sleeves, etc. Coil springs 622 are good for producing force in a linear direction, but require more space than a flat spring and are thus suitable for more widely spaced components.

Figure 7A:
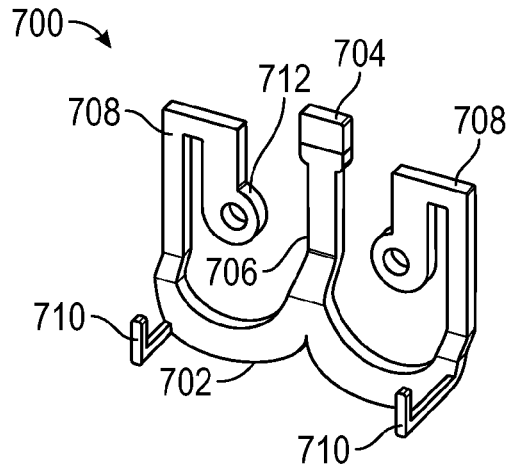
FIG. 7A is a perspective view of a spring that is suitable for the electronics assembly of FIGS. 1-5 in accordance with some embodiments.

FIG. 7A is a perspective view of a spring 700 that is suitable for the electronics assembly 110 of FIGS. 1-5. This "W" shaped spring combines aspects of some of the springs shown in FIGS. 6A-F. A midsection 706 of the spring 700, leading to a pad 704 at the point of the W, acts like a flat spring 602, or a cantilever spring 606 with the free end at the pad 704. The flat spring 602 or cantilever spring 606 extends from a base 702 of the W. Eyelets 712, with apertures 714 (see FIG. 7B) for mounting fasteners, are at the ends of the arms 708 of the W, which extend from the base 702. For each arm 708, the end of the arm 708 and the corresponding eyelet 712 is between a middle portion of the arm 708 and the midsection 706 or cantilever spring portion of the spring 700. This makes a compact arrangement of the spring 700 and fasteners attaching the spring to a member. The eyelets 712 are displaced downward from a horizon established by the pad 704, so that sufficient land can be developed around the eyelets 712 to spread spring action forces and decrease likelihood of distortion of a member to which the spring 700 is mounted. Hooks 710 projecting from sides of the base 702 of the W are for securing to a support member (see FIG. 8).

Figure 7B:
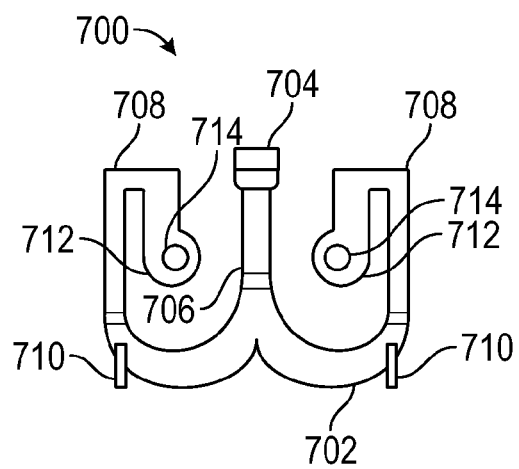
FIG. 7B is an overhead view of the spring of FIG. 7A in accordance with some embodiments.

FIG. 7B is an overhead view of the spring 700 of FIG. 7A. Bend lines are depicted along various geometries of the unitary body. The spring 700 can be constructed from a flat, stamped or machined piece of metal, such as stainless steel or spring steel, with the hooks 710 bent from the flat, and the section 706 of the spring 700 leading to the pad 704 bent the opposite direction, but should not be considered limited to these materials and construction techniques.

Figure 7C:
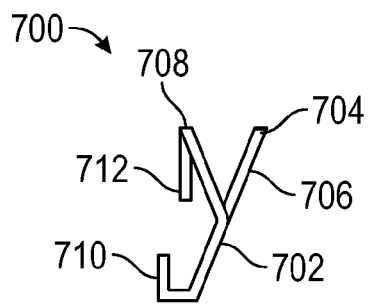
FIG. 7C is a side view of the spring of FIG. 7A in accordance with some embodiments.

FIG. 7C is a side view of the spring 700 of FIG. 7A. Here, it is seen that the spring 700 has some of the characteristics of a V spring 620. Force imparted by the free end of a cantilever portion of the spring 700, at the pad 704, is approximately aligned to two of the mounting points of the spring 700, the eyelets 712. But, unlike the V spring 620, the W shaped spring 700 has more stability at the mounting, because of having four mounting points, namely the two eyelets 712 and the two hooks 710 (see FIGS. 7A and 7B). As can be seen in the side view of the spring 700, each of the arms 708 has bends that offset a middle portion of the arm 708 from a planar surface of the eyelets 712. This allows the middle portion of the arm 708 to flex, relative to the eyelet 712, so that both the arms 708 and the cantilever spring, with the pad 704 at the end of the cantilever portion, flex to participate in spring action of the spring 700. This is what gives the spring 700 some of the characteristics of a V spring 620, as if one arm of the "V" is split into two branches (e.g., the arms 708).

Figure 8:
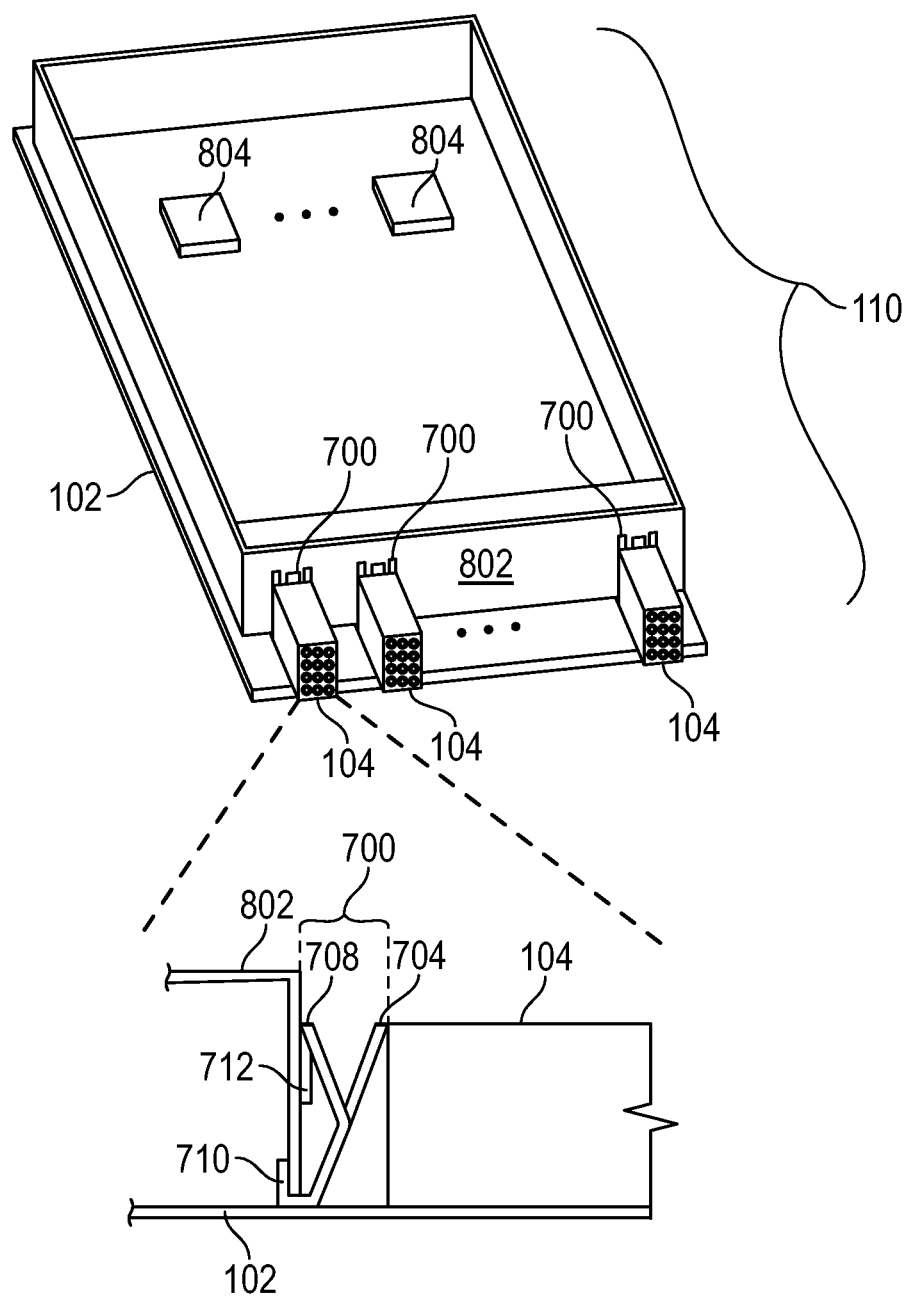
FIG. 8 is a combination perspective view and close up side view of the electronics assembly with the spring of FIGS. 7A-7C attached to a support member and pressing on the connector in accordance with some embodiments.

FIG. 8 is a combination perspective view and close up side view of the electronics assembly 110 with the spring 700 of FIGS. 7A-7C attached to a support member 802 and pressing on the connector 104. Tops of the arms 708 and contact pad 704 of the spring 700 can be seen behind the upper portion of the connector 104 in the drawing. Hooks 710 clip under and behind a vertical portion of the support member 802 of the electronics assembly 110, and the arms 708 are attached to the same vertical portion of the support member 802, for example by fasteners through the apertures 714 (see FIG. 7B). At the pad 704, the spring 700 is pressing on a back face of an upper portion of the connector 104. The support member 802 is mounted to the printed circuit board 102 (or vice versa), for example by various fasteners (not shown, but readily devised). Various electronics components 804 are depicted attached to the printed circuit board 102, but should not be considered limiting as they are by example only. In this embodiment, the W shaped spring 700 is selected to have a shape that is readily mounted in a narrow space, and has a stable mounting with four mounting points mounting the spring 700 to the electronics assembly 110 via the support member 802. The spring constant of the spring 700 is tuned as described with reference to FIG. 5, so as to achieve parallel alignment of the connectors 104, 106 under worst-case assembly force 304 conditions.

Figure 9:
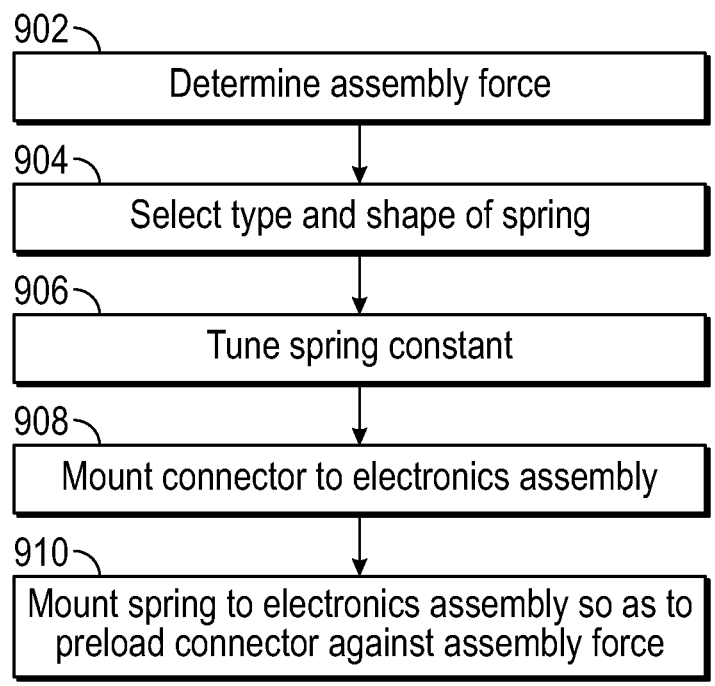
FIG. 9 is a flow diagram of a method to mitigate assembly torsion on an electronics assembly. Practicing this method produces embodiments of the electronics assembly of FIGS. 1-5 and 8, which can use springs such as depicted in FIGS. 6A-6F and FIGS. 7A-C, and variations thereof in accordance with some embodiments.

FIG. 9 is a flow diagram of a method to mitigate assembly torsion on an electronics assembly. Practicing this method produces embodiments of the electronics assembly of FIGS. 1-5 and 8, which can use springs such as depicted in FIGS. 6A-6F and FIGS. 7A-C, and variations thereof. In an action 902, an assembly force is determined. This force, shown in FIGS. 3 and 5 in some embopdiments, acts on the connector and produces assembly torsion on the electronics assembly. An average value, a typical value, or a worst-case value could be selected for the assembly force. In an action 904, a type and shape of spring are selected. Available space, magnitude of spring constant, desired range of approximate linearity of the spring constant or range of force, mounting considerations and other factors should be considered. In an action 906, the spring constant is tuned. Tuning is described with reference to FIG. 5 in some embodiments. In an action 908, the connector is mounted to the electronics assembly. The connector could be mounted directly to a printed circuit board, a substrate and/or a support member. In an action 910, the spring is mounted to the electronics assembly, so as to preload the connector against the assembly force. The various forces and geometrical considerations are described above, with reference to FIGS. 3-8.

Detailed illustrative embodiments are disclosed herein. However, specific functional details disclosed herein are merely representative for purposes of describing embodiments. Embodiments may, however, be embodied in many alternate forms and should not be construed as limited to only the embodiments set forth herein.

It should be understood that although the terms first, second, etc. may be used herein to describe various steps or calculations, these steps or calculations should not be limited by these terms. These terms are only used to distinguish one step or calculation from another. For example, a first calculation could be termed a second calculation, and, similarly, a second step could be termed a first step, without departing from the scope of this disclosure. As used herein, the term "and/or" and the "/" symbol includes any and all combinations of one or more of the associated listed items.

As used herein, the singular forms "a", "an" and "the" are intended to include the plural forms as well, unless the context clearly indicates otherwise. It will be further understood that the terms "comprises", "comprising", "includes", and/or "including", when used herein, specify the presence of stated features, integers, steps, operations, elements, and/or components, but do not preclude the presence or addition of one or more other features, integers, steps, operations, elements, components, and/or groups thereof. Therefore, the terminology used herein is for the purpose of describing particular embodiments only and is not intended to be limiting.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Although the method operations were described in a specific order, it should be understood that other operations may be performed in between described operations, described operations may be adjusted so that they occur at slightly different times or the described operations may be distributed in a system which allows the occurrence of the processing operations at various intervals associated with the processing.

Various units, circuits, or other components may be described or claimed as "configured to" perform a task or tasks. In such contexts, the phrase "configured to" is used to connote structure by indicating that the units/circuits/components include structure (e.g., circuitry or mechanical features) that performs the task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. 112, sixth paragraph, for that unit/circuit/component. Additionally, "configured to" can include generic structure (e.g., generic circuitry) that is manipulated by software and/or firmware (e.g., an FPGA or a general-purpose processor executing software) to operate in manner that is capable of performing the task(s) at issue. "Configured to" may also include adapting a manufacturing process (e.g., a semiconductor fabrication facility) to fabricate devices (e.g., integrated circuits or manufactured articles) that are adapted to implement or perform one or more tasks, or designing an article or apparatus to have certain features or capabilities.

The foregoing description, for the purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the embodiments and its practical applications, to thereby enable others skilled in the art to best utilize the embodiments and various modifications as may be suited to the particular use contemplated. Accordingly, the present embodiments are to be considered as illustrative and not restrictive, and the invention is not to be limited to the details given herein, but may be modified within the scope and equivalents of the appended claims.

What is claimed is:

1. A mechanism to mitigate assembly torsion on an electronics assembly, comprising:
   an electronics assembly;
   a first connector, mounted to the electronics assembly with a lower portion of the first connector proximal to the electronics assembly and an upper portion of the first connector distal to the electronics assembly; and
   a spring, mounted so as to press the upper portion of the first connector and preload the first connector against assembly force imparted by assembly of the first connector to a second connector, wherein the spring acts to rotate the first connector downward, relative to a portion of the electronics assembly, so as to counteract upward rotation of the first connector resulting from the assembly force.

2. The mechanism of claim 1, wherein the spring acts to mitigate assembly torsion that flexes the electronics assembly, arising from pressing the electronics assembly to assemble the first connector to the second connector.

3. The mechanism of claim 1, wherein:
   a front face of the first connector mates to a front face of the second connector; and
   a first end of the spring is attached to a support member of the electronics assembly and a second end of the spring presses an upper portion of a rear face of the first connector.

4. The mechanism of claim 1, wherein the spring includes one or more of: a flat spring, a leaf spring, a cantilever spring, or a V spring.

5. The mechanism of claim 1, wherein the spring has a cantilever spring at a midsection of the spring, the midsection supported by two arms.

6. The mechanism of claim 1, wherein:
   the first connector is mounted at an edge of the electronics assembly.

7. The mechanism of claim 1, wherein:
   a front face of the first connector mates to a front face of the second connector;
   a spring constant of the spring is selected so as to tilt an upper portion of the front face of the first connector forward relative to a lower portion of the front face of the first connector, prior to assembly of the first connector to the second connector; and
   the spring constant of the spring is further selected so as to align the front face of the first connector in parallel with the front face of the second connector when the assembly force is imparted to the first connector by the assembly of the first connector to the second connector.

8. An electronics assembly, with torsion mitigation, comprising:
   an electronics assembly;
   a first connector, mounted to the electronics assembly and configured to couple to a second connector that is mounted to a further electronics assembly, wherein a lower portion of the first connector is closer to the electronics assembly than an upper portion of the first connector;
   a spring, mounted to the electronics assembly and pressing the upper portion of the first connector so as to bias the first connector in opposition to an assembly force resulting from pressing the electronics assembly to couple the first connector to the second connector and the further electronics assembly; and
   the spring having a shape and a spring constant such that a front face of the first connector is tilted or rotated forward, relative to a portion of the electronics assembly, by the spring pressing a back face of the first connector, in absence of the assembly force, and the front face of the first connector is parallel to a front face of the second connector when the first connector is coupled to the second connector in presence of a maximum value of the assembly force.

9. The electronics assembly of claim 8, wherein the pressing the electronics assembly to couple the first connector to the second connector creates a torsion that flexes the electronics assembly, and the spring acts to mitigate such torsion and flexing.

10. The electronics assembly of claim 8, wherein:
    the spring is mounted to the electronics assembly via a support member attached to the electronics assembly.

11. The electronics assembly of claim 8, wherein at least a portion of the spring is one or more of: a flat spring, a leaf spring, a cantilever spring, or a V spring.

12. The electronics assembly of claim 8, further comprising:
    the spring, having a base and a cantilever spring extending from the base;
    the base of the spring having hooks and arms;
    the arms and hooks of the spring attached to a support member of the electronics assembly; and
    a portion of the cantilever spring pressing a back face of the upper portion of the first connector.

13. A method to mitigate assembly torsion on an electronics assembly, comprising:
    mounting a first connector to an electronics assembly, with a lower portion of the first connector closest to the electronics assembly; and
    mounting a spring to the electronics assembly, with a portion of the spring pressing an upper portion of the first connector so as to preload the first connector to oppose assembly force from assembly of the electronics assembly and the first connector to a second connector, wherein the assembly force rotates the first connector upward relative to a portion of the electronics assembly; and
    the spring acts to oppose upward rotation of the first connector relative to the portion of the electronics assembly.

14. The method of claim 13, wherein:
    pressing the electronics assembly to assemble the first connector to the second connector results in assembly torsion that flexes the electronics assembly and rotates the first connector upwards relative to the electronics assembly; and
    the spring and the preload to the first connector counteract the assembly torsion.

15. The method of claim 13, wherein mounting the spring to the electronics assembly comprises:
    mounting the spring to a support member; and
    mounting the support member to the electronics assembly.

16. The method of claim 13, further comprising:
mounting the spring as one or more of: a flat spring, a leaf spring, a cantilever spring, or a V spring.

17. The method of claim 13, further comprising:
shaping the spring as a cantilever spring attached to a base having arms, wherein mounting the spring to the electronics assembly includes attaching the arms of the spring to a support member of the electronics assembly.

18. The method of claim 13, wherein:
mounting the first connector to the electronics assembly comprises mounting the first connector to an edge of the electronics assembly.

19. The method of claim 13, further comprising:
selecting a worst-case assembly force imparted to the first connector by the assembly of a front face of the first connector to a front face of the second connector; and
selecting a spring constant of the spring that aligns the front face of the first connector and the front face of the second connector in parallel when the worst-case assembly force is applied, wherein the spring tilts an upper portion of the first connector forward relative to the lower portion of the first connector in absence of the worst-case assembly force.

\* \* \* \* \*